(12) United States Patent  
Chan et al.

(10) Patent No.: US 6,712,527 B1  
(45) Date of Patent: Mar. 30, 2004

(54) FIBER OPTIC CONNECTIONS AND METHOD FOR USING SAME

(75) Inventors: Benson Chan, Vestal, NY (US); Mitchell S. Cohen, Millwood, NY (US); Paul F. Fortier, Richelieu (CA); Ladd W. Freitag, Rochester, NY (US); Richard R. Hall, Endwell, NY (US); Glen W. Johnson, Yorktown Heights, NY (US); How Tzu Lin, Vestal, NY (US); John H. Sherman, Lisle, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/481,903

(22) Filed: Jan. 12, 2000

(51) Int. Cl.[7] ................................................. G02B 6/36
(52) U.S. Cl. .............................. 385/88; 385/89; 385/92
(58) Field of Search ............................. 385/53, 75, 76, 385/80–94; 359/152, 173; 361/709, 760

(56) References Cited

U.S. PATENT DOCUMENTS

| | | | | |
|---|---|---|---|---|
| 4,912,521 A | * | 3/1990 | Almquist et al. ............ 359/152 |
| 5,121,457 A | | 6/1992 | Foley et al. ................... 385/89 |
| 5,420,954 A | | 5/1995 | Swirhun et al. ............... 385/92 |
| 5,432,630 A | | 7/1995 | Lebby et al. ................ 359/152 |
| 5,454,814 A | | 10/1995 | Comte ........................ 606/75 |
| 5,574,814 A | * | 11/1996 | Noddings et al. ............ 385/90 |
| 5,631,988 A | | 5/1997 | Swirhun et al. ............... 385/89 |
| 5,768,456 A | | 6/1998 | Knapp et al. ................. 385/49 |
| 5,774,614 A | | 6/1998 | Gilliland et al. .............. 385/88 |
| 5,781,682 A | | 7/1998 | Cohen et al. ................. 385/89 |
| 5,818,994 A | | 10/1998 | Hehmann .................... 385/89 |
| 5,832,150 A | | 11/1998 | Flint ............................ 385/31 |
| 5,940,562 A | * | 8/1999 | Henson et al. ................ 385/88 |
| 6,071,016 A | * | 6/2000 | Ichino et al. ................. 385/92 |
| 6,072,613 A | * | 6/2000 | Henningsson et al. ....... 359/152 |
| 6,116,791 A | * | 9/2000 | Laninga et al. ............... 385/83 |
| 6,164,838 A | * | 12/2000 | Maehara et al. .............. 385/92 |
| 6,234,687 B1 | * | 5/2001 | Hall et al. .................... 385/88 |
| 6,318,909 B1 | * | 11/2001 | Giboney et al. .............. 385/90 |

OTHER PUBLICATIONS

Toshiaki Satake et al., "MT Multifiber Connectors and New Applications", 1994 ECTC, pp. 994–999.

M.S. Cohen et al., "Packaging Aspects of the Jitney Parallel Optical Interconnect," 1998 ECTC, pp. 1206–1215.

J. Crow et al., "The Jitney Parallel Optical Interconnect," 1996 ECTC, pp. 292–300.

Optobus (Motorola), L.J. Norton et al., "Optobus I: A Production Parallel Fiber Optical Interconnect," 1997 ECTC, pp. 204–209.

The PAROLI (Siemens) project, "Parallel Optical Link for Multichannel Gigabit Rate Interconnections," H. Karstensen et al., 1998 ECTC, pp. 747–754.

K. Katsura et al., "Packaging for a 40 Channel Parallel Optical Interconnection Module with an Over 25–Gbit/s Throughput," 1998 ECTC, p. 755–761.

(List continued on next page.)

Primary Examiner—Rodney Bovernick  
Assistant Examiner—Juliana K. Kang  
(74) Attorney, Agent, or Firm—Salzman & Levy; Lawrence R. Fraley

(57) ABSTRACT

A package is described that couples a twelve channel wide fiber optic cable to a twelve channel Vertical Cavity Surface Emitting Laser (VCSEL) transmitter and a multiple channel Perpendicularly Aligned Integrated Die (PAID) receiver. The package allows for reduction in the height of the assembly package by vertically orienting certain dies parallel to the fiber optic cable and horizontally orienting certain other dies. The assembly allows the vertically oriented optoelectronic dies to be perpendicularly attached to the horizontally oriented laminate via a flexible circuit.

23 Claims, 8 Drawing Sheets

OTHER PUBLICATIONS

In the POLO 980nm DuPont project, by K. Hahn et al., "Gigabyte/s Data Communications with the POLO Parallel Optical Link," 1996 ECTC, pp. 301–307.

A Hitachi package by A. Miura et al., "Reliable Compact, CMOS Interface, 200 Mbit/s x 12–Channel Optical Interconnects Using Single–Mode Fiber Arrays," 1997 ECTC, pp. 225–230.

A Takai et al., "200 Mb/s/ch 100–m Optical Subsystem Interconnections Using 8–Channel 1.3–mm Laser Diode Arrays and Single–Mode Fiber Arrays," J. Lightwave Tech., vol 12, pp. 260–270, 1994.

N. Tanaka et al., "3.5 Gb/s x 4 ch Optical Interconnection Module for ATM Switching System," 1997 ECTC pp. 210–216.

T. Nagahori, "I–Gbyte/sec Array Transmitter and Receiver Modules for Low Cost Optical Fiber Interconnection," 1996 ECTC pp. 255–258.

Y.S. Liu et al., "Plastic VCSEL Array Packaging and High Density Polymer Waveguides for Board and Backplane Optical Interconnect," 1998 ECTC, pp. 999–1005.

(Lucent, Honeywell, Un. Minnesota, Un. Illinois), Y.M. Wong et al, "Optoelectronic Technology Consortium Parallel Optical Data Link: Components, System Applications, and Simulation Tools," 1996 ECTC, pp. 269–278.

P. Rosenberg et al., "The PONI–I Parallel–Optical Link" 1999 Electronic Components and Technology Conference, pp 763–769.

Michael Lebby, Craig A. Gaw, Wenbin Jiang, P.A. Kiely, Chan Long Shieh, P.R. Claisse, Jamal Ramdani, Davis W. Hartman, Daniel B. Schwartz and Jerry Grula, "Characteristics of VCSEL Arrays for Parallel Optical Interconnecs". Photonics Technology Center, Tempe, Arizona, 1996 Electronic Components and Technology Conference, pp 279–291.

L.J. Norton et al., OPTOBUS I: A Production Parallel Fiber Optical Interconnect, 1997 ECTC, pp. 204–209.

* cited by examiner

FIBER OPTIC CONNECTIONS AND METHOD FOR USING SAME

FIELD OF THE INVENTION

The present invention relates to fiber optical connections and, more particularly, to a structure and method for coupling a multiple channel fiber optic cable to a multiple channel Vertical Cavity Surface Emitting Laser (VCSEL) transmitter and a multiple channel Perpendicularly Aligned Integrated Die (PAID) receiver.

BACKGROUND OF THE INVENTION

The invention seeks to construct a package for coupling a multiple channel fiber optic cable to a multiple channel Vertical Cavity Surface Emitting Laser (VCSEL) transmitter and a multiple channel Perpendicularly Aligned Integrated Die (PAID) receiver. The active surface of both the receiving and transmitting dies (hereinafter "optoelectronic dies") are oriented perpendicular to the plane of the laminate package. The package can be soldered directly to an end user card with its cables plugged directly through the tail stock. In other words, the cable can exit from the card in a direction parallel to the plane of the card.

Other advantages of this design are:

1) it has integrated strain relief, a latching detent, and safety features;
2) it uses available processes and materials;
3) it comprises a plastic ball grid array (PBGA) laminate for high speed operation and low cost;
4) it has a two-part construction design with independent testing of each part to improve overall yield;
5) it allows two strategies for removing heat from the package;
6) it includes various incorporated features to minimize electrical cross-talk, radiated RF and susceptibility to external RF; and
7) it incorporates several features that serve to protect optical surfaces and electronic components from damage.

The development of this type of design has proven to be difficult, since solid state devices (often referred to either as dies or chips), with active components on one side only, are usually mounted parallel to the card, with their optically active features perpendicularly oriented to receive or emit light. It becomes necessary, therefore, to provide means for orienting the optoelectronic chips perpendicular to the card so that the emitted or received light enters the package parallel to the card while maintaining the profile (height above the card) low enough to meet specified limitations imposed by the end user.

Among the features incorporated into the design are:

1) an overmolded ball grid array (BGA) that strengthens and stiffens the relatively weak BGA laminate. (This is needed because the carefully aligned optics, which must be held in place, are integrated into the package);
2) a package having integrated strain relief for the cable/connector with direct mechanical coupling to the card, to prevent disturbing the optical portions;
3) use of relatively low cost materials, assembly procedures and standard processes;
4) separate grounds within the BGA, a two part lid, a shroud and pins on the carriers for minimizing:
  a) cross-talk from receiver to transmitter,
  b) radiated RF power, and
  c) susceptibility to RF pickup;
5) incorporation of many standard features of overmolded packages to minimize cost and susceptibility to damage;
6) an improved assembly/test strategy (to keep yields high and costs low); and
7) a dual path strategy for removing heat from the package to keep the optoelectronic parts cool enough for high speed operation.

DISCUSSION OF RELATED ART

There have been a number of attempts to develop a package and/or product that meets the general requirements of a parallel fiber optic link. A package developed for the JITNEY project, a government funded package developed at IBM by M. S. Cohen et al., "Packaging Aspects of the Jitney Parallel Optical Interconnect," 1998 ECTC, pp. 1206–1215; and J. Crow et al., "The Jitney Parallel Optical Interconnect," 1996 ECTC, pp. 292–300, consisted of separate transmitter and receiver modules and two separate cables to complete a bi-directional optical link. The cable contained 20 fibers for the simultaneous transmission of 20 channels of information at the full data rate. This design permitted the transmission of two bytes of information, along with four bits of overhead, in each bit time. The transmitter module contained a driver chip (differential inputs) and a VCSEL transmitter. Both chips were mounted on a heatsink. The heatsink and chips were parallel to the module and the card.

A specially designed array lens served to redirect the light emitted from the VCSEL (perpendicular to the card) into the input face of the fibers which were disposed parallel to the card. Similarly, the receiver module contained a receiver chip (generating differential outputs) also oriented parallel to the module. The same array lens was used to redirect the light emerging from the optical fibers into the direction perpendicular to the card, so that the light to be detected impinged upon the surface of the receiver substantially perpendicular to the photosensitive surface of the receiver. Although several similarities may be found in the JITNEY package, it did not attempt to solve the crosstalk problem (transmitter to receiver). It used two separate modules. JITNEY had a separate strain-relief, used a leadframe (instead of a BGA), and generally did not use packaging techniques expected to support data transmission rates of 1 Gigabit per second per channel or more.

Two versions of link transceiver modules developed for the Motorola Optobus project are described in two papers: "Characteristics of VCSEL Arrays for Parallel Optical Interconnects," 1996 Electronic Components and Technology Conference (ECTC), pp. 279–291; and "Optobus I: A Production Parallel Fiber Optical Interconnect," 1997 ECTC, pp. 204–209. Both modules have in common a number of packaging features: 1) a surface emitting VCSEL array is used, the light path is parallel to the host card plane, and the optoelectronic component is mounted perpendicular to the module's BGA laminate, 2) a molded plastic waveguide structure conducts the light to/from the optoelectronic die to endfaces of the fibers in ribbon optical cables, the cables being terminated with MT connectors, 3) a glob encapsulated, multi-chip pin grid array laminate board is provided on which the optoelectronic subassembly is mounted, and 4) the resulting package is nonhermetic.

As fabricated, the loss of the low-loss waveguides is some tenths of a dB/cm. To meet safety goals and to increase the amount of optical power reaching the detector, the waveguides for the transmitter and for the receiver portions of this transceiver are not constructed identically. On the transmitter side, the waveguide is designed to increase the numerical aperture of the entering beam as the light passes from the VCSEL to the optical fiber. On the receiver side, the waveguide is designed to improve coupling efficiency from the optical fiber to the photodetector. A passive alignment procedure (i.e., the optical elements are not electrically activated during the procedure) is used to align the array of optically active elements on the optoelectronic dies to the molded structure which contain an array of waveguides.

In the Optobus transceiver (the 1996 paper), a leadframe for delivering the electrical signals to the optoelectronic die is overmolded and serves as the supporting structure for the waveguide arrays. Electrical connections are made from finished ends of the leadframe conductors, a nonstandard packaging approach, to contact pads on the top surface of the optoelectronic dies. The other end of each of the leadframe's conductors, which are routed to exit points along the side of the molded waveguide structure and then bent down to attachment points, are electrically connected to pads on the top surface of the laminate board.

In the optobus I transceiver (the 1997 paper), a tape automated bonding (TAB) leadframe is used to replace the electrical function of the standard leadframe in the earlier version. The conductors on one end of this TAB leadframe make electrical contact to the optoelectronic dies and, on the other end, to contacts on the top surface to the laminate board. The TAB leadframe is bent 90 degrees between the two ends. Again, alignment between the molded waveguide structure and the optoelectronic dies is accomplished using a passive alignment technique.

The PAROLI (Siemens) project, "Parallel Optical Link for Multichannel Gigabit Rate Interconnections," H. Karstensen et al., 1988 ECTC, pp. 747–754, comprised an optical coupler which redirected the light 90 degrees. An array of multimode fibers was captured in a transfer-molded holder. The end of the fiber array was polished at an angle, and the optically active chips were die bonded in position below the polished facets, so that the light followed the desired path. Active alignment was used to position the chips in the facets. The optical coupler mated to an MT type of optical connector. Nonhermetic packaging was used.

To make the link, two separate 12-channel modules were used, one for the transmitter and one for the receiver. An AC coupled link was built with a data rate of 1 Gbit/s for each channel; a DC coupled link was built with a data rate of 500 Mb/s for each channel.

A PARABIT (NTT) 40-channel parallel optical interconnection module with a throughput in excess of 25 Gbit/s, K. Katsura et al., "Packaging for a 40 channel Parallel Optical Interconnection Module with an Over 25-Gbit/s Throughput," 1998 ECTC, pp. 755–761, comprised a transceiver consisting of 20 transmitting and 20 receiving channels in one module, and utilized a multimode fiber. A 250 mm pitch was used, with 850 $\mu$m VCSELs and GaAs pin photodiodes. Light was carried to and from the optically active chips by means of polymeric waveguides, which were cut at 45 degrees in order to redirect the photon path. Passive alignment of the chips to the waveguides was used, where the principle of index alignment was employed. A unique "bare-fiber" connector was used to couple the waveguides to the fibers. There, bare fibers protruded from the end of the connector. The fibers were inserted into micro capillaries, which were mated to the polymeric waveguides. The fibers were buckled to create a constant force on the ends of the waveguides, in order to maintain good physical contact.

In the POLO 980 nm DuPont project, by K. Hahn et al., "Gigabyte/sec Data Communications with the POLO Parallel Optical Link," 1996 ECTC, pp. 301–307, a bottom-emitting VCSEL array chip was used with a PIN photodiode. These chips were incorporated into two widely spaced sub-modules, each of which had 10 channels. Each channel was projected to operate at 1 Gbit/s. The optical coupler which transmitted light to and from the MT connector was based on polymer waveguides, and consisted of commercially available "Polyguide" (DuPont) waveguides. A 90° redirection in the light path was accomplished by providing a 45° bevel in the end of the polyguide, thereby forming a mirror. The optically active chips were first diebonded, before the polyguide was aligned.

A Hitachi package by A. Miura et al., "Reliable, Compact, CMOS Interface, 200 Mbit/s×12-channel Optical Interconnects Using Single-Mode Fiber Arrays," 1997 ECTC, pp. 225–230; and A. Takai et al., "200 Mb/s/ch 100-m Optical Subsystem Interconnections Using 8-Channel 1.3-mm Laser Diode Arrays and Single-Mode Fiber Arrays," J. Lightwave Tech., vol. 12, pp. 260–270, 1994, comprised 200 Mb/s×12 channel optical interconnects using single-mode fiber arrays. The Hitachi modules, which are separate transmitter and receiver modules, were designed for long wavelength single-mode operation. For this purpose 1.3 $\mu$m edge-emitting lasers were used, together with full hermetic sealing. Planar microlens arrays were employed for light coupling. An array of 12 channels was used for both the transmitter and receiver modules. Each channel ran at 200 Mbit/s. The fibers were placed in silicon V grooves for accurate placement. Alignment was accomplished by first roughly aligning using stereo microscope image processing, and accurate adjustment was then accomplished using computer controlled, two-dimensional scanning.

A 3.5 Gbit/s×4 ch Interconnect (NTT), by N. Tanaka et al., "3.5 Gb/s×4 ch Optical Interconnection Module for ATM Switching System," 1997 ECTC pp. 210–216, provided a structure for a multichannel fiber optic package using silicon V-groove technology to provide a 4-channel fiber array with the fibers encased in micro-capillaries. The fiber ends were hemispherically lensed. Passive alignment was used by bonding the edge-emitting laser to the same silicon substrate which held the fibers. The same principle was used for the photodiode array, but the fiber lenses were slant polished in this case. In both cases a fiber pitch of 250 mm was used. Each channel was operated at 3.5 Gbit/s.

A one Gbyte/s Array (NEC), by T. Nagahori, "1-Gbyte/sec Array Transmitter and Receiver Modules for Low Cost Optical Fiber Interconnection," 1996 ECTC pp. 255–258, comprised silicon V grooves used in conjunction with edge emitting lasers. The laser was passively aligned to the silicon substrate by solder-bump technology, as was the monitor photodiode. No lenses were used there. The light was redirected 90 degrees to the photodiode by etching a slope on the silicon submount and metallizing. A 1.3 $\mu$m wavelength was used. Eight channels operating at 200 Mb/s each gave a 1 Gb/s throughput.

In the POINT project (GE, Amp, Honeywell, Allied Signal), Y. S. Liu et al., "Plastic VCSEL Array Packaging and High Density Polymer Waveguides for Board and Backplane Optical Interconnect," 1998 ECTC, pp. 999–1005, a plastic VCSEL array package was provided with high density polymer waveguides, for a board and backplane optical interconnect. POINT was a demonstration project to show feasibility of low cost VCSEL and receiver array packaging. There, a GE process was used to attach the optically active chips to a polymer film on which conductor lines had previously been defined. Next, epoxy encapsulant was introduced in order to impart good mechanical stability to the structure. A polymer film was fabricated over the chips. This polymer film was patterned by a precision laser micromachining system in order to fabricate passive alignment features into the film. These alignment features were keyed to fiducial marks on the chips. The alignment features were used for passive alignment of polymer waveguides to the optically active chips. The system permitted 10 channels each for the transmitter and receiver sides of the package. The modules were apparently not given full functional tests.

Another package was developed by OETC (Lucent, IBM, Honeywell, Univ. Minnesota, Univ. Illinois), Y. M. Wong et al., "Optoelectronic Technology Consortium Parallel Optical Data Link: Components, System Applications, and Simulation Tools," 1996 ECTC , pp. 269–278.

Yet another package (Hewlett Packard Laboratories and Univ. of North Carolina) was described by P. Rosenberg et al. in a paper entitled "The PONI-1 Parallel-Optical Link", 1999 Electronic Components and Technology Conference, IEEE, pp. 763–769. The PONI devices separated the receiver and transmitter functions, and did not disclose a transceiver device, nor a faraday barrier, which permits the close proximity of the transmitting and receiving functions. No means was disclosed to allow the pins to be prealigned before final accurate engagement occurs. The PONI device permitted pin engagement of an MT connector directly to a metal heatsink/base. The PONI alignment scheme was "passive", in that electrically active optoelectronic components were not energized to assist in the alignment process. An electronic chip was mounted close to the optoelectronic device, both chips mounted perpendicularly relative to the board on which the PONI package was mounted, significantly raising the height profile of the overall package. Because the chips were located in close proximity to one another, heat removal from the sensitive optoelectronic part was problematical, since the more heat tolerant electronic device required heat removal, as well. That is, removing heat from the relatively heat tolerant device had to be accomplished without damaging the more sensitive optoelectronic part.

Some of the differences of the current invention over the aforementioned art are as follows:

The package of this invention does not use polymer films which serve as waveguides anywhere in its construction. The use of optically transparent media spanning the distance from the optoelectronic chip to the optical coupler is anticipated, but this is not a light guiding structure.

The invention uses an array of fiber stubs to form the optical coupler.

The invention does not use silicon bench (silicon V groove) technology in its module except, possibly, in the construction of the optical coupler portion of the module. Silicon bench technology may be used in the fabrication of the ferrule portion of the connector used to terminate the array of fibers in the cable.

The invention does not use self-aligning solder-bump attachment techniques within the module.

The invention is a transceiver module, using surface emitting rather than edge emitting lasers, and does not use microlenses.

The invention does not use leadframes.

The preferred fabrication approach uses active alignment.

In U.S. Pat. No. 5,420,954, issued to Swirhun et al on May 30, 1995 for PARALLEL OPTICAL INTERCONNECT, an optical interconnect that couples multiple optical fibers to an array of optoelectronic devices, is illustrated. The patent describes a parallel connection between the chip and the fiber cable. The connection of these parts are very close, but it is not desirable to have a removable part so close to sensitive electronic parts.

In U.S. Pat. No. 5,818,994, issued to Hehmann, on Oct. 6, 1998 for DEVICE FOR THE UNADJUSTED COUPLING OF A NUMBER OF OPTICAL WAVEGUIDES TO A LASER ARRAY, a coupling of optical fibers to a laser array is shown. The patent teaches a non-removable connection between the optoelectronics and the optical fiber array.

In U.S. Pat. No. 5,832,150, issued on Nov. 3, 1998 to Flint, for SIDE INJECTION FIBER OPTIC COUPLER, a coupler is illustrated that couples an asymmetrical beam of a laser diode into a fiber optic cable. The device depicts a reflective end face to reflect laser radiation. The input facet is approximately parallel to the central axis of the array.

In U.S. Pat. No. 5,631,988, issued on May 20, 1997 to Swirhun et al for PARALLEL OPTICAL INTERCONNECT, an optical interconnect is shown that couples multiple optical fibers to an array of optoelectronic devices with a parallel orientation.

In U.S. Pat. No. 5,121,457, issued to Foley et al on Jun. 9, 1992 for METHOD FOR COUPLING LASER ARRAY TO OPTICAL FIBER ARRAY, a method is disclosed of using V-grooves to align individual fibers in precise relationship to their light emitting devices. The fibers have polished end face facets at forty-five degrees, which are orthogonally attached to a mating configured surface.

In U.S. Pat. No. 5,454,814, issued on Nov. 12, 1996 to Noddings et al for PARALLEL OPTICAL TRANSCEIVER LINK, an optical interconnect module is shown that mates with an optical fiber connector having a parallel orientation. The link comprises a sapphire window having metallized features for conducting electronic signals to a VCSEL.

In U.S. Pat. No. 5,781,682, issued to Cohen et al on Jul. 14, 1998 for LOW COST PACKAGING FOR PARALLEL OPTICAL COMPUTER LINK, a coupling apparatus is shown for coupling a connector of a parallel optical cable to a receiver or transmitter array.

In U.S. Pat. No. 5,774,614, issued on Jun. 30, 1998 to Gilliland et al for OPTOELECTRONIC COUPLING AND METHOD OF MAKING SAME, a coupling is depicted that provides an optoelectronic device to be attached and aligned with a flexible substrate whose end face is mounted to an optical waveguide, similar to that shown for the present invention. The flexible waveguide provides the ability to orient the connection. The present invention departs from this patent by incorporating strain relief latching, RF isolation, reduction in electrical cross-talk, a heatsink, and fabrication with a protective overmolding.

In U.S. Pat. No. 5,432,630, issued on Jul. 11, 1995 to Lebby et al for OPTICAL BUS WITH OPTICAL TRANSCEIVER MODULES AND METHOD OF MANUFACTURE, a transceiver module is shown which includes both semiconductor devices and optoelectronic devices, as well as coupling features for attaching a parallel cable. The optical coupler is an array of molded waveguides, not an optical coupler made of an array of fibers. No overmold is used, nor are details provided regarding how strain relief or any prealignment function is accomplished. No disclosure of back side electrical contact to the light generating or light receiving devices is made. No means are provided by which heat is removed from the various heat generating elements. This would be important, especially at high operating speeds. No flexible circuit is disclosed for conducting current from the top surface of the laminate to the optoelectronic chips.

SUMMARY OF THE INVENTION

In accordance with the present invention, there is provided a single package for coupling a multiple channel fiber optic cable to a multiple channel Vertical Cavity Surface Emitting Laser (VCSEL) transmitter and for coupling a second multiple channel fiber optic cable to a multiple channel Perpendicularly Aligned Integrated Die (PAID) receiver. The active surface of both the receiving and transmitting (optoelectronic) dies are oriented perpendicular to the plane of the laminate package. The package can be soldered directly to an end user card, and have its cable plugged directly through the tail stock. In other words, the cable can exit from the card in a direction parallel to the plane of the card.

The package article comprises a laminate table or board (hereinbelow referred to simply as a laminate) upon which amplifier dies, preferably attached by wirebonds or other attachment means known in the art, are supported. The laminate carries an overmold frame that houses, optionally, a faraday barrier shield for RF isolation purposes. The overmold frame supports an optical subassembly which accepts an optical connector that is attached to an end of the parallel fiber optic cable. A retainer substantially encloses an optical coupler. Attached to the optical coupler is a heatsink carrier which, in turn, supports an optoelectronic die. One function of the heatsink carrier is to remove heat from the optoelectronic die. The heat drawn into the heatsink carrier may be dissipated into the nearby air. Optionally, the heat may pass through a heat conducting compound to a package cover where it is then dissipated to the air.

Electrically attached to the optoelectronic die is a flexible circuit. The flexible circuit itself can be electrically attached to the heatsink carrier. The flexible circuit is mechanically supported by the heatsink carrier using an adhesive. One purpose of the flexible circuit is to reorient the electrical signals from pads on the surface of the laminate to pads on the optoelectronic die, which is substantially perpendicular to the plane of the laminate.

Optoelectronic elements on the optoelectronic die are aligned with the optical coupler and end faces of the optical fibers in the connectors, so that optical signals pass from the optoelectronic elements to the optical fibers. The space between the optoelectronic die and the nearby end face of the optical coupler is optionally filled with a substantially transparent material. This transparent material also serves as a weak mechanical link between these two elements. Shock forces applied to the optical coupler are thus prevented from adversely affecting the optoelectronic die. The transparent material also assists in protecting the optoelectronic die from environmental sources of contamination.

An optical coupler subassembly consists of the optical coupler, the heatsink carrier, the optoelectronic die and the flexible circuit. The optical coupler is secured to the heatsink carrier on one distal end thereof. The optical connector, secured to one end of a parallel fiber optic cable, is partially contained within a receptacle in the retainer and held by a latch mechanism against the other distal end of the optical coupler. The optical coupler comprises an array of optical fibers mounted substantially within a protective housing. The end faces of the protective housing and the optical fibers are prepared so that the end faces of the optical fibers have an optical finish.

The optical subassembly consists of the optical coupler subassembly attached to the retainer. Specifically, the optical coupler portion of the optical coupler subassembly fits into a receiving bore in the retainer. The retainer has mechanical features which serve to align it to similar complementary features in the overmold frame. In a preferred embodiment, the retainer and optical coupler subassembly are adhesively attached to each other.

The package article can be a transceiver on a single laminate for receiving and transmitting.

OBJECTS OF THE INVENTION

It is an object of this invention to provide an improved coupling assembly between a horizontally oriented fiber optic cable, and a vertically oriented optoelectronic die.

It is another object of the invention to provide a method for accepting signals from a host card and generating corresponding high-current signals for transmitting to an optoelectronic die; and for accepting low-current signals generated by the optoelectronic die and amplifying and digitizing the received signals to levels suitable for transmitting to the host card.

It is yet another object of the invention to provide a transceiver that has a vertically oriented die and that accepts a horizontally oriented parallel fiber optic cable, wherein forces applied by the optical connector to externally accessible parts of the package article are substantially mechanically isolated from the optoelectronic die.

BRIEF DESCRIPTION OF THE DRAWINGS

A complete understanding of the present invention may be obtained by reference to the accompanying drawings, when considered in conjunction with the subsequent detailed description, in which.

For purposes of clarity and brevity, similar elements and components of the optical assembly of this invention will bear the same designation and numbering throughout all the figures.

DESCRIPTION OF THE PREFERRED EMBODIMENT

Generally speaking, the invention features a package for coupling a removable multiple channel parallel fiber optic cable to a corresponding multiple channel vertical cavity surface emitting laser (VCSEL) transmitter and for coupling a removable multiple channel parallel fiber optic cable to a multiple channel perpendicularly aligned integrated die (PAID) receiver.

The orientation of the fibers of the parallel fiber optic cable is parallel to the host card to which the package article is attached. It should be understood that optoelectronic devices may also be configured in arrays or in other predetermined patterns.

The transceiver allows for a reduction in the height of the package article by orienting the plane of the optoelectronic dies perpendicular to the plane of the laminate. The vertically oriented transmitting and receiving optoelectronic dies are attached to the horizontally oriented laminate via a flexible circuit.

Figure 1:
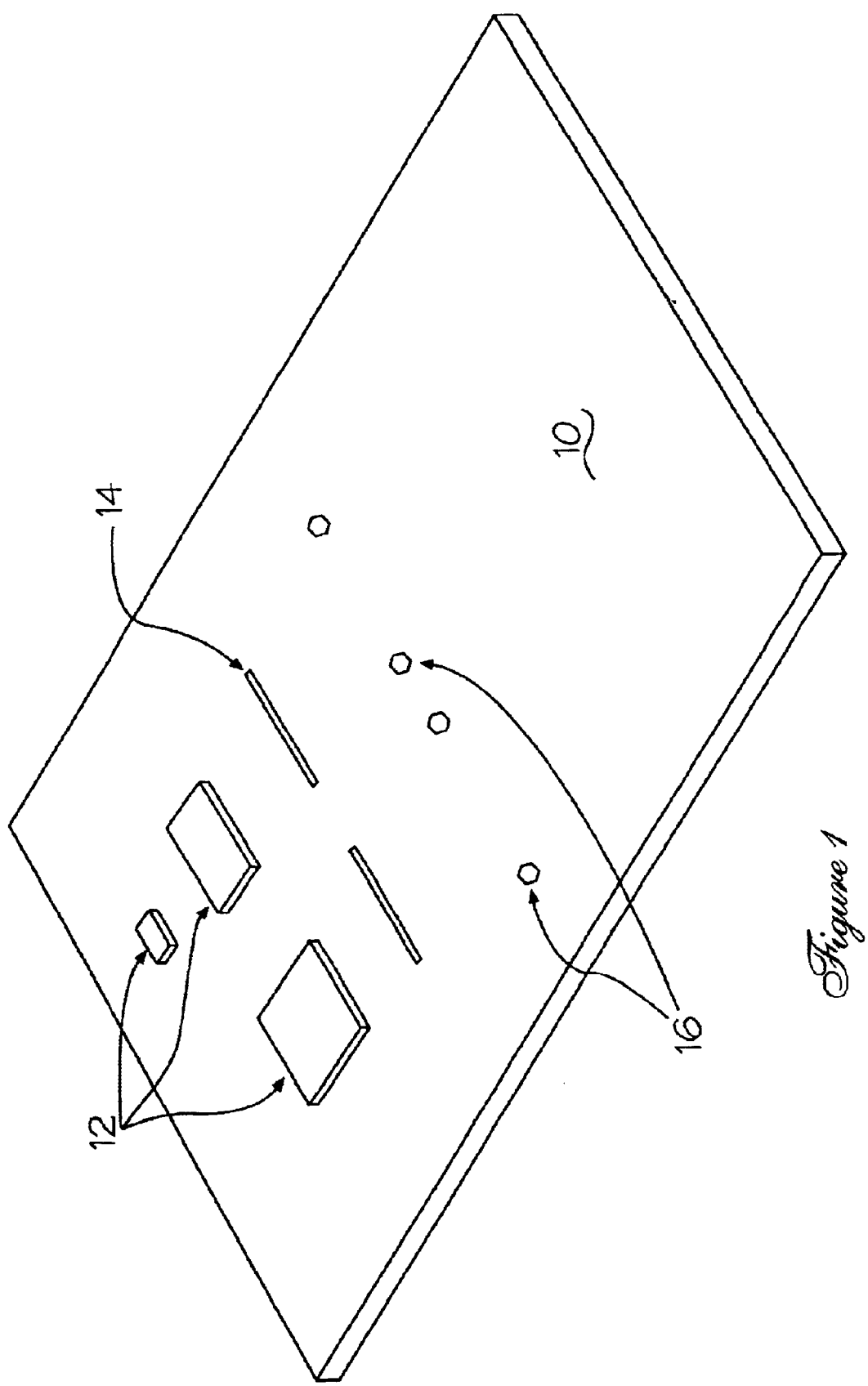
FIG. 1 illustrates a perspective view of a die supporting laminate that forms part of the package article of this invention.
Figure 3:
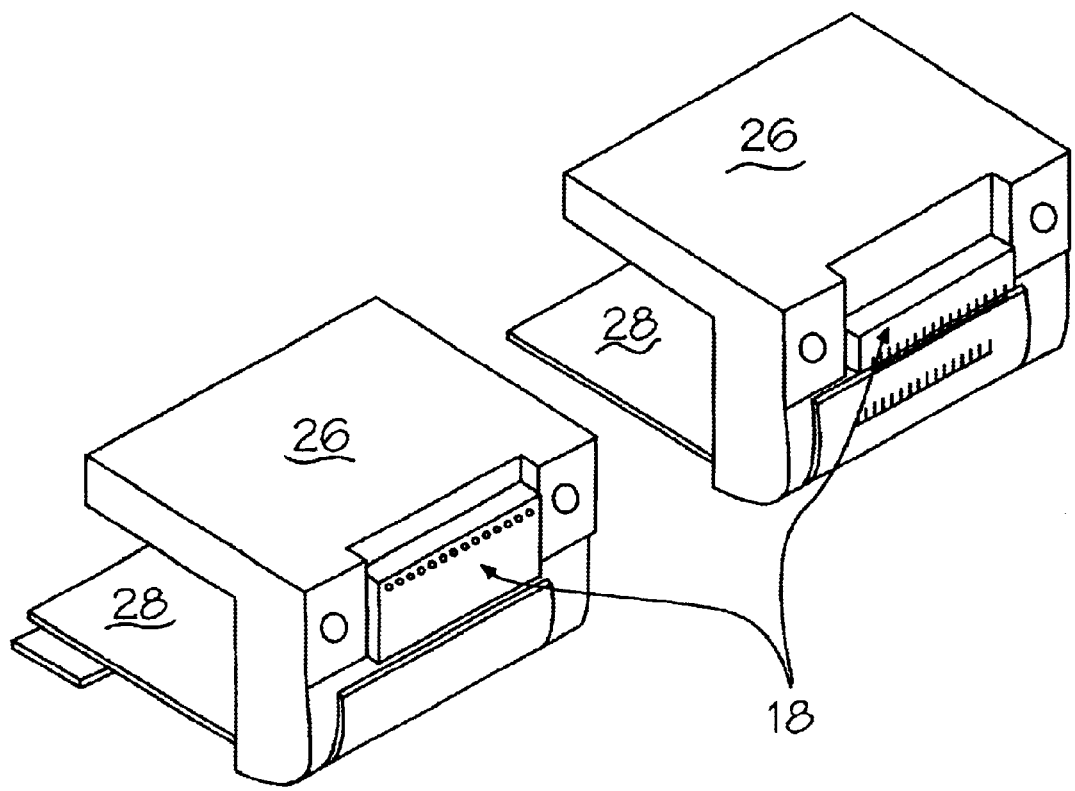
FIG. 3 shows a perspective view of two heatsink carriers that support optoelectronic dies (e.g., a transmitting, preferably a VCSEL, or optical receiver) and flexible circuits, and which are enclosed within the overmold frame depicted in FIG. 2.

Now referring to FIG. 1, a laminate 10 horizontally supports wirebond dies 12. These wirebond dies 12 lie parallel to the plane of the laminate surface. One of two optoelectronic dies 18, shown in FIG. 3, is secured to a heatsink carrier 26 and is oriented perpendicularly with respect to the wirebond dies 12. The plane of the laminate 10 is substantially perpendicular (horizontal) with respect to the vertically oriented optoelectronic dies 18.

Figure 5:
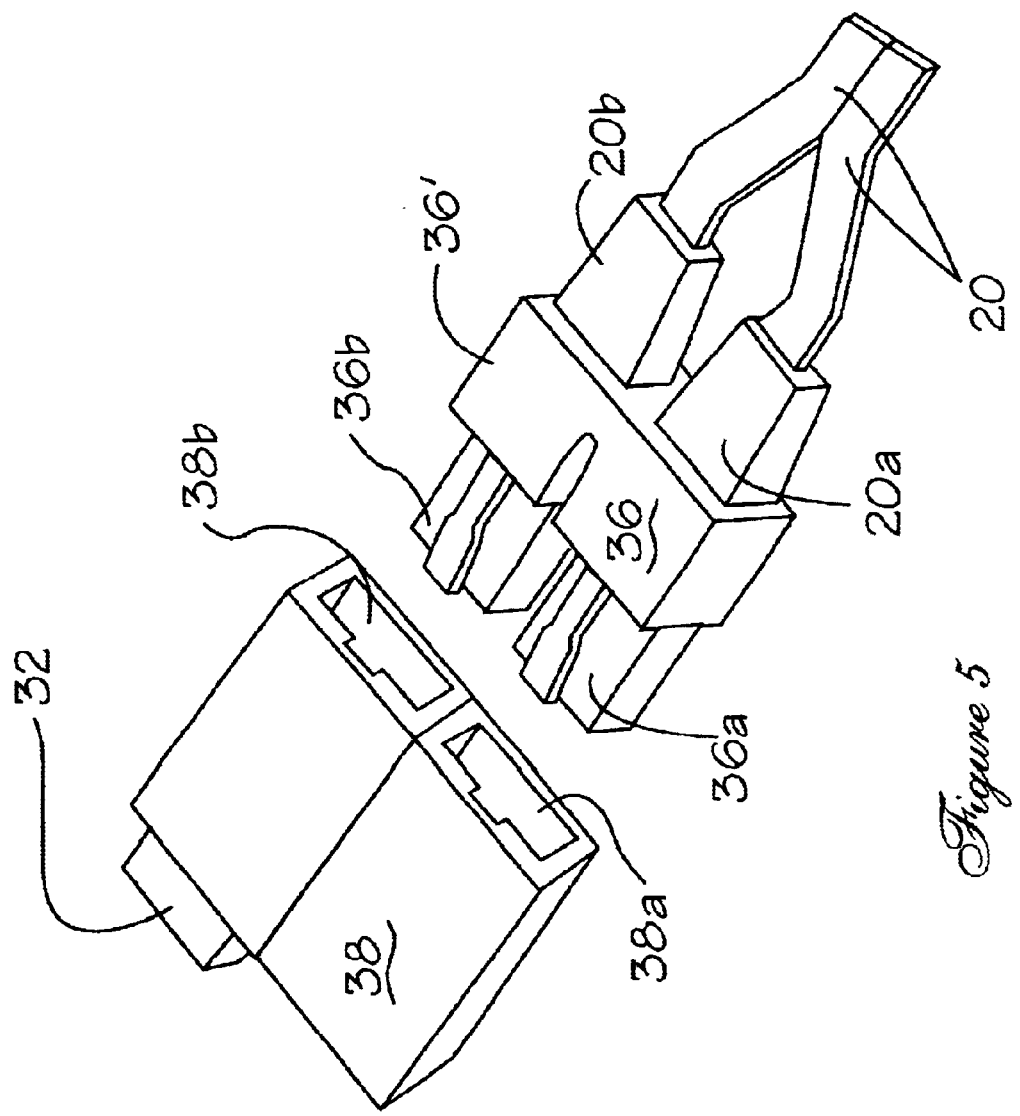
FIG. 5 depicts, in perspective view, the parallel fiber optic cable with optical connectors thereon attached as it would be seen when approaching the receiving bores of the retainers. Attached to one distal end of one of the two elements of the transceiver is one of two optical couplers.

The overall structure has the advantage that the transceiver so (FIG. 8) has a low profile. Electrical contact pads or balls, not shown, are disposed on the bottom side of the laminate 10 and may be soldered directly to a host card (not shown) for the purpose of relaying electronic signals from the host card to the electronic components within the transceiver, while fiber optic cables 20 can be plugged directly through the tail stock. In other words, cables 20 (FIG. 5) exit from the overall transceiver assembly 50 parallel to the horizontal plane of the laminate 10.

Figure 2:
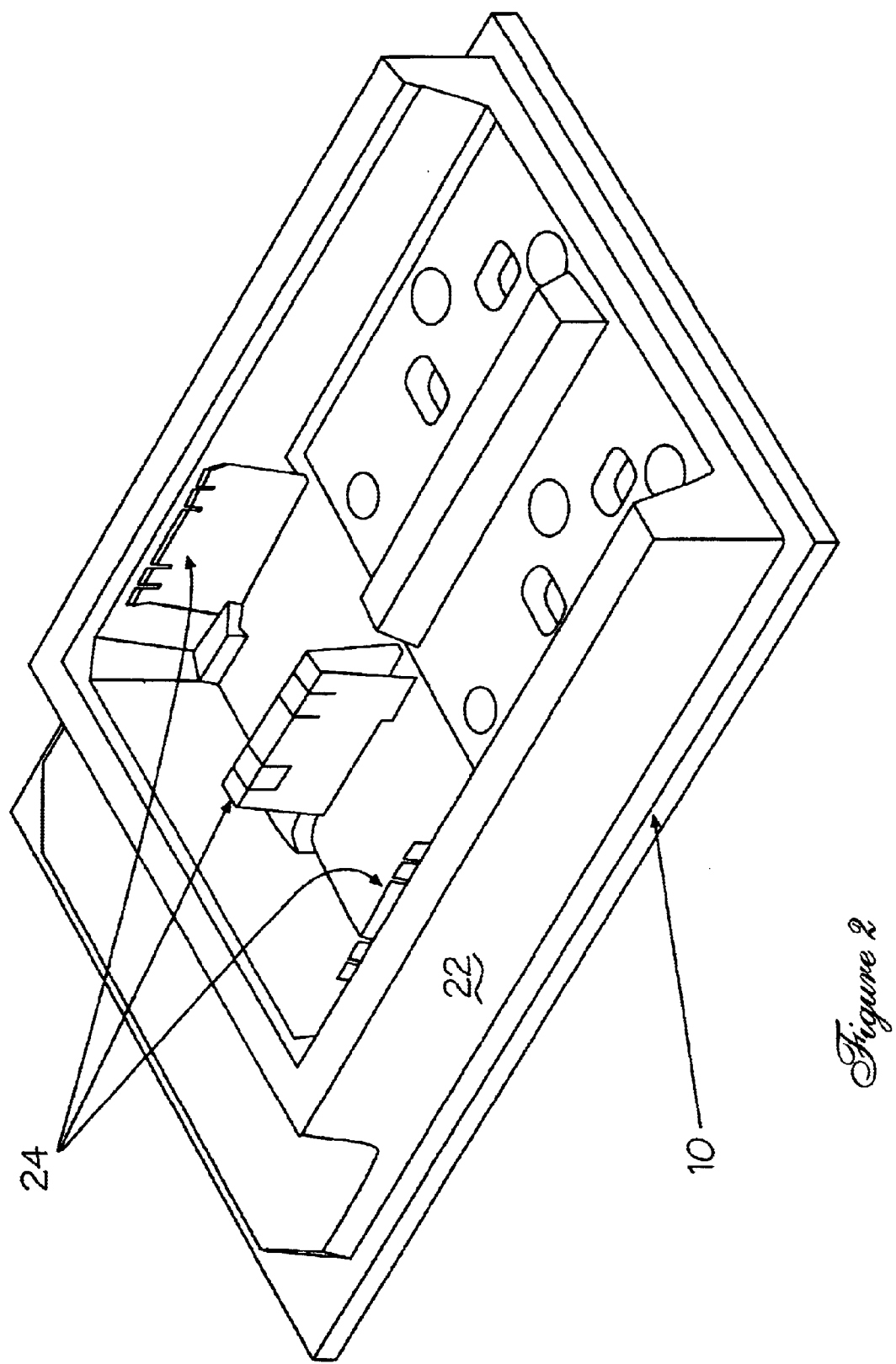
FIG. 2 depicts a perspective view of the overmold frame disposed over the laminate illustrated in FIG. 1.

An overmold frame 22, shown in perspective view in FIG. 2, rests on and is bonded to the top surface of laminate 10. The overmold frame 22 can house a faraday barrier shield 24, one half electrically isolating the transmitting section, and the other half electrically isolating the receiving section of the transceiver 50. The electrical isolation serves both to reduce capacitively and inductively coupled high frequency electrical signals, and to reduce the amount of electromagnetic power that is radiated from the transceiver assembly 50.

Figure 4:
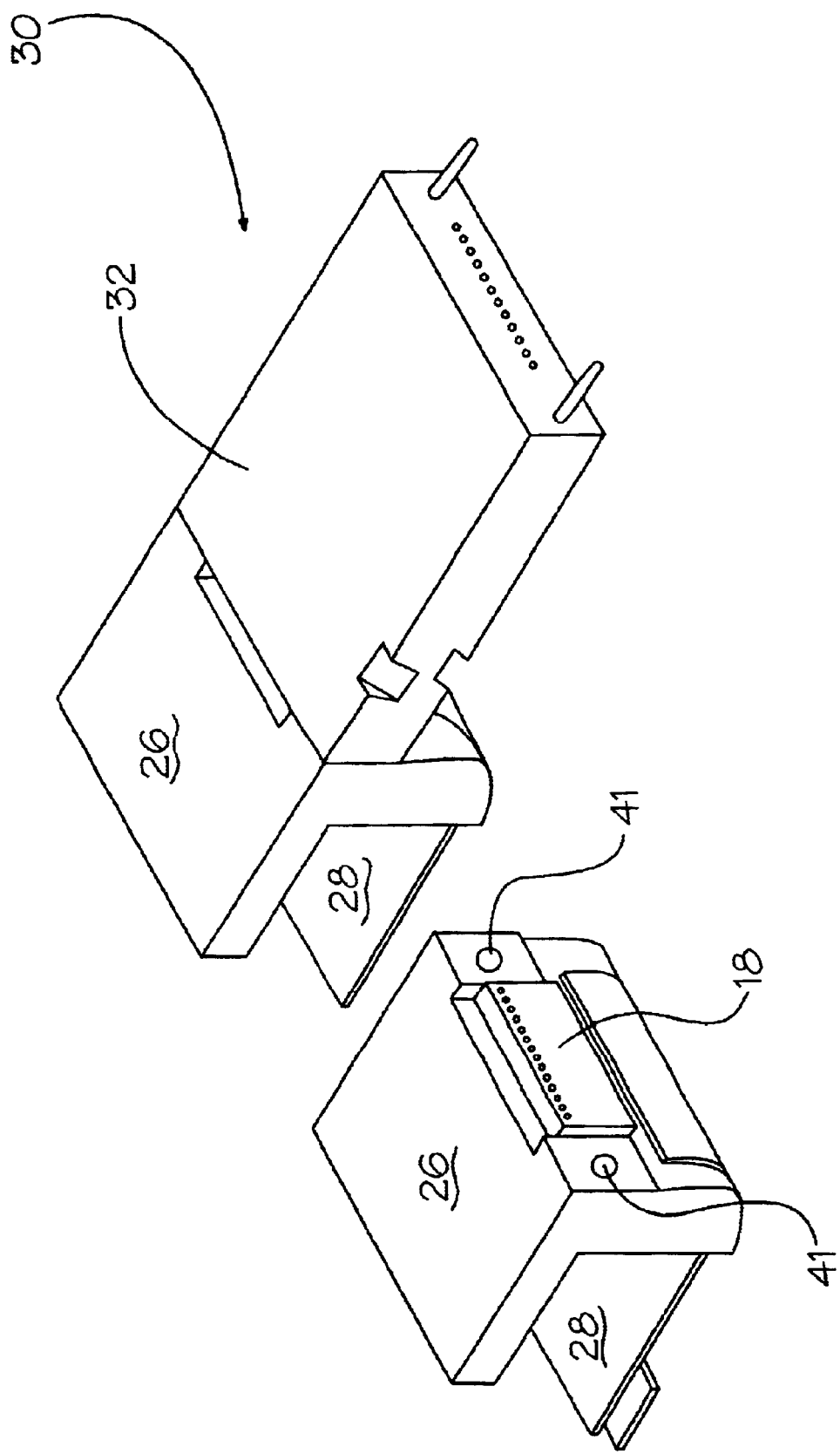
FIG. 4 illustrates, in perspective view, some of the components of the transceiver as they are positioned relative to one another. One side of the transceiver shows the heatsink carrier with the flexible circuit exiting below it, with the optical coupler not shown, for clarity. The second side of the transceiver shows the carrier secured to the optical coupler. The other side of the transceiver shows the heatsink carrier with the flexible circuit exiting below it and with one end of the flexible circuit in close proximity to one edge of the optoelectronic die, the bonds between the optoelectronic die and the flexible circuit not being shown.

The overmold frame 22 supports and encloses a heatsink carrier 26, shown in FIGS. 3 and 4, with an attachment optoelectronic die 18. Parallel fiber optic cable 20 (FIG. 5) is divided into two portions 20a and 20b and is terminated in a parallel fiber optic connector 36. The connector 36 is inserted into a retainer 38, thereby coarsely aligning the transmitting and the receiving sides of the parallel fiber optic connector 36 with their respective retainer receptacles. After each of the two sides 36a and 36b of the parallel fiber optic connector 36 is partially inserted in a bore 38a and 38b, respectively, of retainer 38, engagement with fine alignment pins, not shown, is made. After full insertion is accomplished, the end faces of each of the two sides 36a and 36b of the parallel fiber optic connector 36 are held in position so that light may pass between the respective elements of the individual optoelectronic devices and the fiber end faces of their corresponding optical fibers within the parallel fiber optic cable 20. Secured to the optoelectronic die 18, and optionally secured to heatsink carrier 26, is a flexible circuit 28.

One function of the flexible circuit 28 is to provide a first attachment end oriented for convenient connection from pads on the laminate 10 to wiring on the flexible circuit 28. This requires that a first end of the flexible circuit 28 must be substantially parallel to laminate 10. Individual wiring channels or leads on flexible circuit 28 are substantially aligned to nearby corresponding terminal pads spaced out along a terminal pad array 14 on the surface of laminate 10.

A second function of the flexible circuit 28 is to provide a second attachment oriented for convenient connection from pads on the optoelectronic die 18. This requires that a second end of the flexible circuit 28 must be substantially parallel to optoelectronic die 18, where the individual wiring channels (leads) on flexible circuit 28 are also substantially aligned to nearby corresponding pads (not shown) on the optoelectronic die 18. The pads on optoelectronic die 18 are electrically attached to the wiring channels on flexible circuit 28, which is mechanically or otherwise secured to heatsink carrier 26. Optionally, there may be electrical connections made from heatsink carrier 26 to wiring channels on flexible circuit 28.

Between its two ends, flexible circuit 28 is bent approximately 90 degrees since optoelectronic die 18 is oriented perpendicular to laminate 10. Thus, during and after connection, parallel fiber optic connector 36 (FIG. 8) approaches fiber optic coupling assembly 30, shown in FIGS. 6 and 8, parallel to the host card (not shown) to which laminate 10 of fiber optic coupling assembly 30 is attached.

Figure 8:
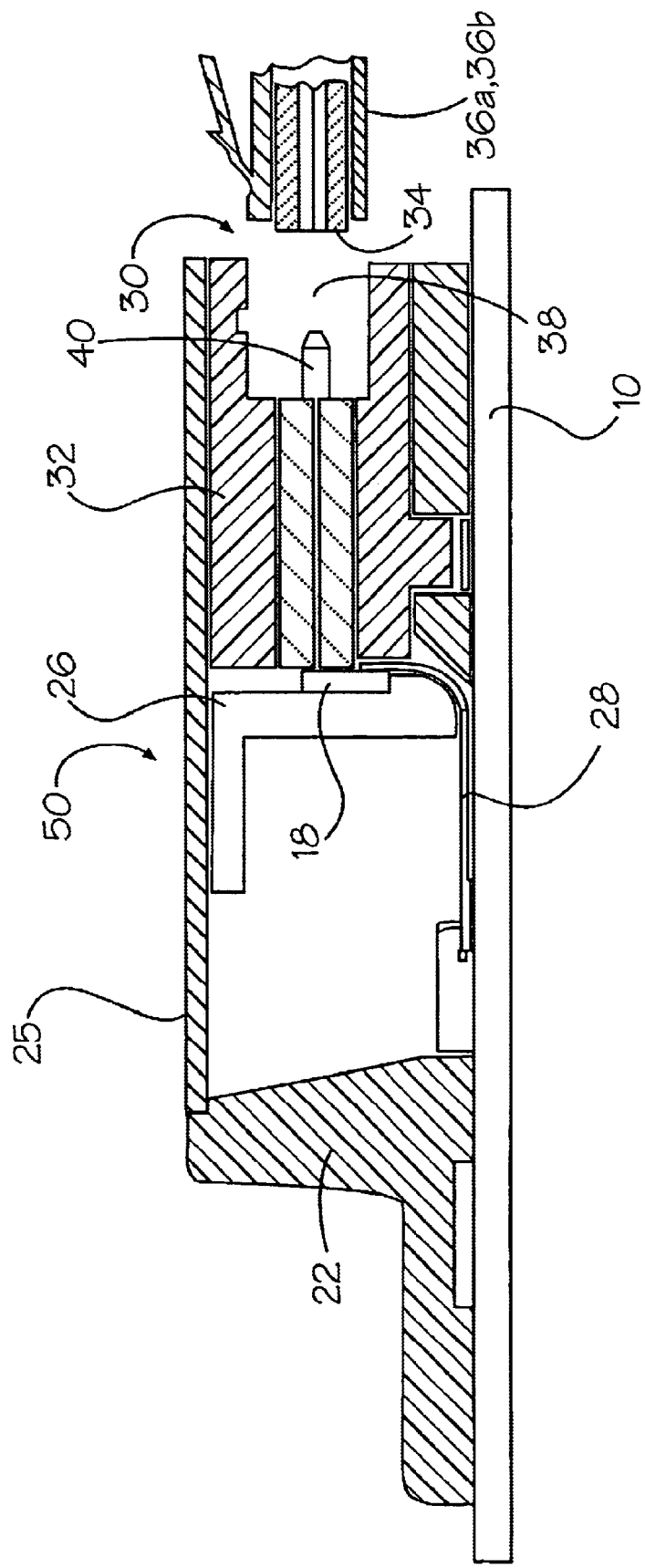
FIG. 8 depicts in cross-sectional view the overall fabrication of the package article of this invention.

Referring now to FIG. 8, the fiber optic coupling assembly 30 consists of an optical coupler 32, a heatsink carrier 26, a flexible circuit 28, and an optoelectronic die 18. Cable termination 34 plugs into the fiber optic coupling assembly. The optical coupler 32 is attached to the heatsink carrier 26. Heatsink carrier 26 has optoelectronic die 18 attached thereon. Attachment is accomplished by a thermally and electrically conductive adhesive, not shown. Retainer 38 holds optical coupler 32. One distal end of each optical coupler 32 faces a corresponding optoelectronic die 18; the other distal end of each optical coupler 32 faces the optically terminated end faces of the respective connectors 36a and 36b. The optical coupler 32 is substantially enclosed within retainer 38 (FIG. 5), so that one end of optical coupler 32 protrudes from one end of retainer 38, while the other end of optical coupler 32 is contained within the region enclosed by retainer 38. Each of the two portions of retainer 38 also accepts one respective fiber optic connector 36. The end face of each of the parallel fiber optic connectors 36 is accurately positioned within its corresponding retainer 38 relative to the end face of the optical coupler 32, which is also secured within retainer 38.

Each portion of the parallel fiber optic connector 36 consists of an optical ferrule having alignment features for accurately aligning with the optical coupler. Protective housing 36' contains connectors 36a and 36b that are coarsely aligned to the respective receptacle 38a and 38b of retainer 38, firmly holding the connector 36 partially within its retainer 38. The means by which the connector 36 is held in the retainer 38 is a latching mechanism (e.g., RJ), consisting of snap-in features molded into the protective housing 36' and into the retainer.

Figure 6:
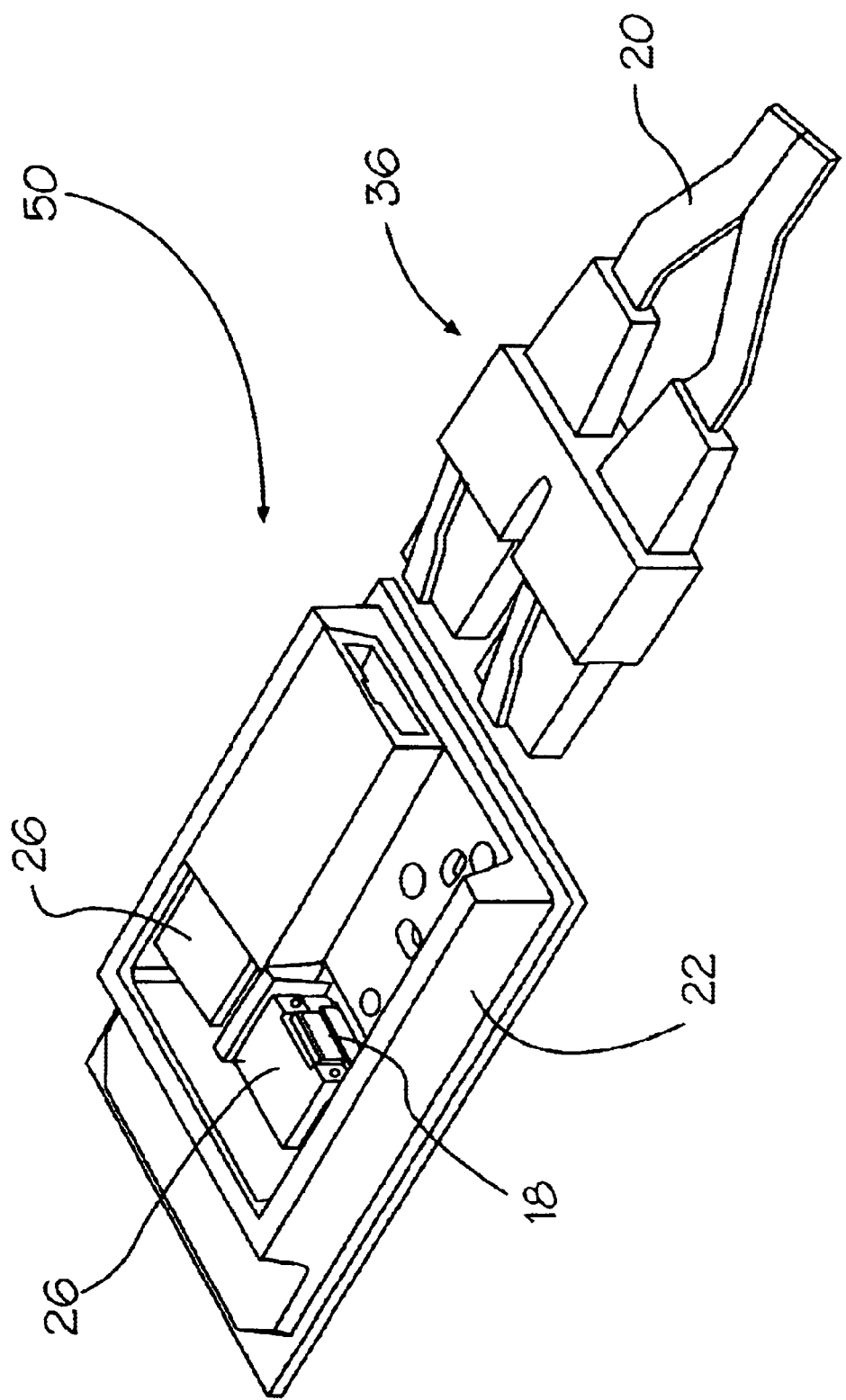
FIG. 6 shows a perspective view of a selection of parts of the package article placed in their proper position along with the optical connectors and parallel fiber optic cable of FIG. 5. The parts of the transceiver shown are two heatsink carriers, one optoelectronic die, one flexible circuit, the laminate, the overmold frame, one retainer and the faraday barrier shield. Also shown in the overmold frame are features for accepting, in proper alignment, the retainer.

The retainers and attached coupler subassembly 30 are supported within the overmold frame 22, as shown in FIGS. 6 and 8.

Referring again to FIG. 1, the laminate 10 comprises grounding pads 16 and terminal pads 14. Grounding pads may be used for electrically coupling to the heatsink carrier. They may also be used for electrically coupling to the faraday barrier shield. Terminal pads 14 are used for electrically coupling to the leads on flexible circuit 28 (FIG. 4).

Referring now to FIG. 3, the optoelectronic dies 18 (GaAs, for example) are placed onto heatsink carrier 26. Optical coupler 32 is attached to locating features on heatsink carrier 26 so that the optically active areas of the optical coupler 32, namely the individual fiber end faces, are accurately aligned to the optically active areas of the optoelectronic die 18. The pattern of active areas is shown to be linear for purposes of this description, but it should be understood that any other array configuration or other predetermined pattern could also be incorporated. Such active areas are individual VCSELs on the transmitter side and individual PAID photodetectors on the receiver side.

To aid in the assembly and alignment of carrier 32 and heatsink carrier 26, carrier holes 41 are provided to accept pins 40 from coupler 32, not shown in FIG. 3.

Heat removal from the optoelectronic dies 18 is facilitated by heatsink carrier 26, which provides a low thermal resistance path for heat flow from optoelectronic dies 18 to the package cover 25 (FIG. 8), which assists in removing heat from the package article. The heatsink carrier 26 may be made of die cast zinc or molded aluminum, magnesium or copper. The base metal of the heatsink carrier 26 can be plated or treated with various metals, such as zinc and nickel, and may have a final plating of gold. The gold may be selectively coated for the purpose of enhancing the attachment of the channel wiring of flexible circuit 18. One method of attachment is single point tape automated bonding. The heatsink carrier 26 may be constructed using a variety of known techniques such as forming, stamping, coining a molding.

The optical subassembly is positioned upon the overmold frame 22 using alignment features molded into both retainer 38 and overmold frame 22. The flexible circuit 28 extending from the optical subassembly is bent to follow the shape of the curved lower part of the heatsink carrier 26, thereby redirecting the path of the flexible circuit 28 so that its end lies substantially parallel to and in contact with the surface of laminate 10.

Near the distal, exposed end of the flexible circuit 28, an electrical connection is made to the terminal pads 14 on the surface of laminate 10. This electrical connection may be wirebonded, tape automated bonded, or bonded by other means commonly practiced in the industry. The heatsink carrier 26 may also be bonded, using an electrically conductive adhesive, to grounding pads 16 disposed on the surface of laminate 10.

Alternatively or in addition, faraday barrier shield 24 (FIG. 2) may be attached to grounding pads 16. Faraday barrier shield 24 may also be disposed in physical and electrical contact with a package cover 25 (FIG. 6). Cover 25 can also be used as a heatsink for heat transferred from optoelectronic die 18 via heatsink carrier 26. The various connections to the grounding pads 16 may be accomplished using conductive epoxy, a material that conforms to the electrically conductive and nonconductive portions of the various surfaces, thereby reducing the necessity of building these components to high dimensional and positional tolerances.

A thermal path, separate from the one described hereinabove for the optoelectronic dies, is provided from the wirebond dies 12 through the ball grid array laminate 10 and through the solder balls on the bottom surface thereof to the host card on which the package assembly is mounted. Alternatively, the laminate 10 may be constructed without solder balls but with an array of pads for connection to a receiving socket (not shown).

One layer of the flexible circuit 28 comprises a copper layer with electrical traces (e.g., 0.002" lines and 0.002" spaces) on a polyimide carrier, with solder mask material selectively covering a portion of the copper layer. The copper wiring may be coated with a less chemically reactive metal, such as gold or tin. Multiple layer flex circuits may also be used with thru-via interlayer connections and grid planes to provide higher density and performance.

Windows may be provided through the polyimide carrier to facilitate electrical connection to some of the leads of the copper wiring. The flexible circuit 28 has an open window with suspended leads spanning the window area. Some suspended leads may be electrically coupled to the metal heatsink carrier 26. The leads of the flexible circuit may also be cantilevered in the window region and/or may extend from the end of the flexible circuit. Those cantilevered leads may be electrically coupled to the heatsink carrier 26. Suspended and cantilevered leads may be alternately formed in the window region and selectively electrically coupled to a prepared site on the heatsink carrier 26. Electrically coupling flexible circuit leads to the heatsink carrier 26 can be accomplished by bonding under conditions of heat and ultrasound by the single point tape automated bonding process, which is well known in the electronics packaging industry.

Alignment of the optical coupler 32 to the heatsink carrier 26 is accomplished by inserting small pins 40 (FIG. 8), which are part of the optical coupler 32, into oversized holes (not shown) which are formed in the heat sink carrier 26. This arrangement provides rough alignment between the two parts 26, 32. The annular gap between the pins 40 and their corresponding holes is filled with UV curing adhesive (epoxy). After curing under ultraviolet light, the epoxy rigidly holds optical coupler 32 in its aligned position.

Figure 7:
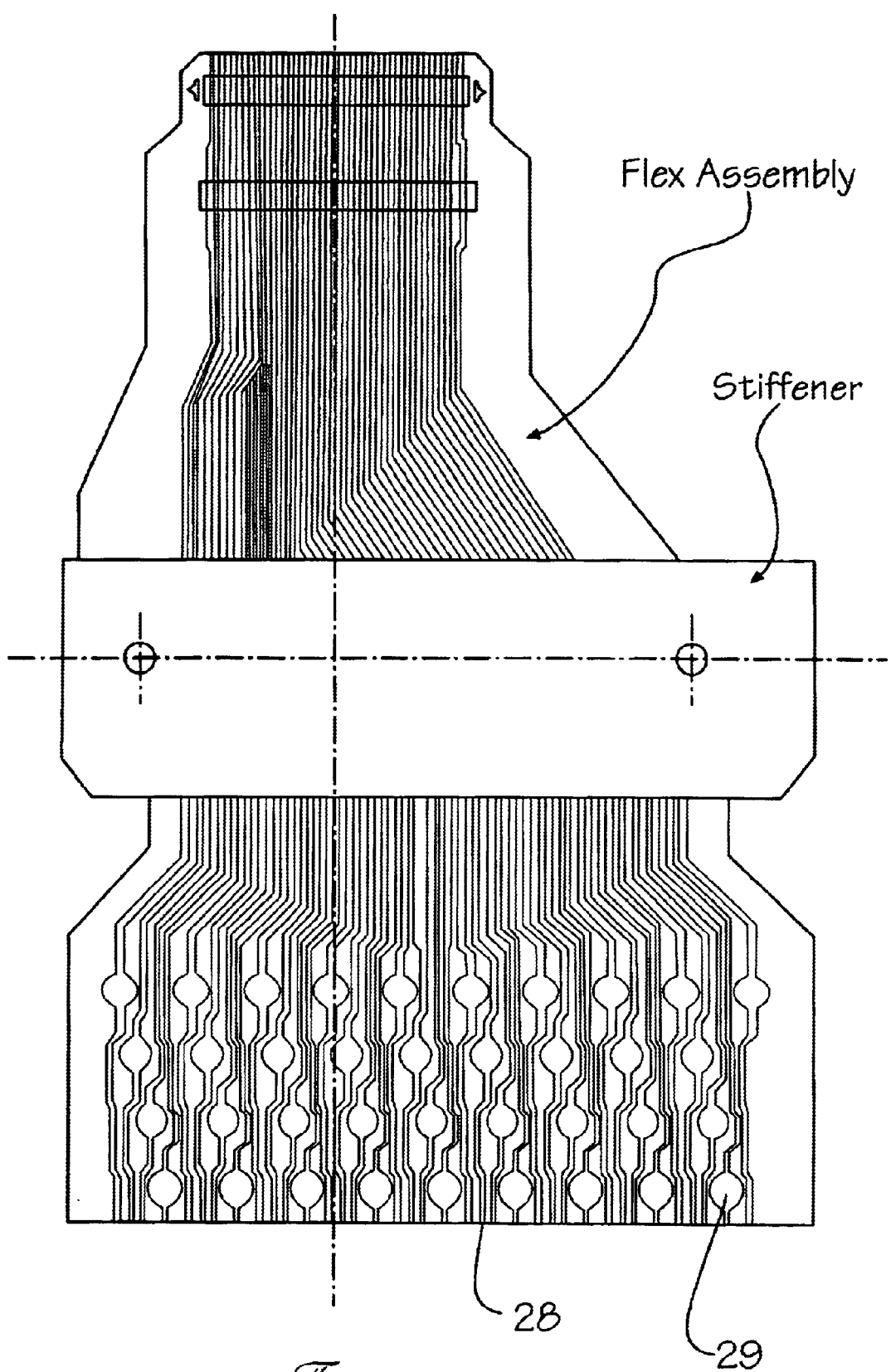
FIG. 7 illustrates in plan view the flexible circuit shown in FIGS. 3, 4 and 6. The depicted flexible circuit has attached thereon a stiffener member and includes as a portion of the flexible circuit a wiring grid of contact pads which is removed before assembly into the transceiver.

Immediately before UV curing begins, the active portions of optoelectronic die 18 are aligned accurately with the corresponding optically active portions of optical coupler 32. This alignment process is accomplished using a process known as active alignment, in which the optoelectronic dies 18 are powered up, as appropriate, for either the transmitting or the receiving optoelectronic die 18, by applying electronic signals to the large two-dimensional pad array 29 at one end of the flexible circuit 28 (FIG. 7). Optical signals pass through an optical cable, not shown, temporarily attached to the connector end of the optical coupler 32, and monitor optoelectronic devices, not shown, that are connected to the other end of this temporarily attached optical cable.

The electronic signals to and from the monitoring optoelectronic device are used during the alignment process. For example, to align a transmitter optoelectronic die 18, electronic signals are applied to the large pads of the flexible circuit 28, while the optical coupler 32 is held by a positioning device against the heatsink carrier 26. The optical coupler pins 40, oppositely disposed to the pins 40 shown on FIG. 8, are inserted in the oversized carrier holes 41 of the heatsink carrier 26, the UV curable adhesive being disposed in the gap between the pins and the holes 41. The diameter of carrier holes 41 is greater than the diameter of the corresponding pins. One or more of the optically active elements of the transmitter optoelectronic die 18, previously mounted on the heatsink carrier 26 and in electrical contact with the wiring on the flexible circuit 28, is thereby activated. Light emerges from the optically active elements of the transmitter optoelectronic die 18. The light of individual, optically active elements passes into corresponding optically active portions of the optical coupler 32. The light passes through the optical coupler 32 and emerges from the distal end thereof at corresponding optically active portions. Then the light passes into the temporary parallel fiber optic cable at corresponding optically active portions, travels through the cable, and emerges onto corresponding photodetectors, not shown. Accordingly, the light emerging from each optically active element of the transmitter optoelectronic device 18 is substantially conveyed to a corresponding photodetector. The alignment task is accomplished by moving the relative position of the optical coupler 32 to the optoelectronic die 18, using the positioning device, so that an optimized amount of light is coupled, as determined by measuring the current generated within the associated photodetectors.

Silicone or optically transparent UV curable epoxy can be applied between optoelectronic die 18 and optical coupler 32 to provide passivation of surfaces of optoelectronic die 18. This material also provides an optical path which does not emerge into air. This is advantageous because relatively large losses of optical power are incurred, due to Fresnel reflections, at each entrance into or egress from air.

Split power and ground planes, not shown, disposed in the laminate 10 control noise and reduce crosstalk between the transmitter and receiver portions of the optoelectronic die 18.

A split heatsink cover, not shown, may be used to control electromagnetic interference (EMI). The heatsink cover can be stamped for economy. Its function is to provide for heat dissipation. The heat dispersed by this heatsink cover is generated substantially at the optoelectronic die 18, and is conveyed by thermal conduction to heatsink carrier 26 and on to the package cover 25, where any gap between the heatsink carrier 26 and the package cover 25 is filled, optionally, with a heat conducting compound, well known in the art.

While the present invention has generally been described with respect to transmitting operations, it should be understood that the inventive device is equally well suited to handle receiving operations, as well. In other words, when transmitting, the package article accepts signals from the host card and generates corresponding high-current signals for transmitting to the optoelectronic die; on the receiving side, the package article accepts low-current signals generated by the optoelectronic die and amplifies and digitizes the received signals to levels suitable for transmitting to the host card.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A package article for removably accepting a fiber optic cable, said package article being adaptable for operatively connecting to a host card, comprising:
   a laminate for supporting optoelectronic components;
   an amplifier die operatively connected to and supported by said laminate for amplifying electrical signals;
   a flexible circuit electrically connected to and supported by said laminate for receiving said amplified electrical signals from said amplifier die;
   an optoelectronic die electrically connected to said flexible circuit for receiving said amplified electrical signals generated by said amplifier die and for generating optical signals responsive thereto; and
   a heat sink carrier operatively connected to said flexible circuit, and attached to said optoelectronic die for removing heat therefrom.

2. The package article for removably accepting a fiber optic cable in accordance with claim 1, said package article further comprising:
   an optical subassembly having means for optically aligning with said optoelectronic die for receiving and processing said optical signals therefrom, said optical subassembly comprising an optical coupler and a removable optical connector having an optical cable.

3. An optoelectronic subassembly for accepting optical signals from a fiber optic cable, said optoelectronic subassembly having means for operatively connecting to a host card, said optoelectronic subassembly comprising:
   an optoelectronic die for receiving electrical signals and for generating optical signals responsive thereto;
   a flexible circuit electrically connected to said optoelectronic die;
   an optical coupler optically connected to said optoelectronic die for receiving optical signals therefrom; and
   a heat sink carrier operatively connected to said flexible circuit, and attached to said optoelectronic die for removing heat therefrom.

4. The optoelectronic subassembly for accepting optical signals from a fiber optic cable in accordance with claim 3, said optoelectronic subassembly further comprising:
   an optical connector removably connected to and in optical communication with said optical coupler; and
   a retainer operatively connected to said optical coupler and removably connected to said optical connector for aligning said optical coupler and optical connector.

5. The optoelectronic subassembly for accepting optical signals from a fiber optic cable in accordance with claim 4, wherein said optical connector further comprises an optic cable.

6. A package article for removably accepting a fiber optic cable, said package article operatively connected to a host card, said package article comprising:
   a flexible circuit for receiving electrical signals;
   an optoelectronic die operatively connected to said flexible circuit for receiving said electrical signal and for generating optical signals responsive thereto; and
   a heatsink carrier operatively connected to said flexible circuit, and attached to said optoelectronic die for removing heat therefrom.

7. The package article in accordance with claim 6, further comprising:
   a laminate for supporting optoelectronic components;
   an amplifier die operatively connected to and supported by said laminate for amplifying electrical signals;
   an optical subassembly in optical communication with said optoelectronic die for receiving and processing said optical signals therefrom, said optical subassembly comprising an optical coupler and a removable optical connector having an optic cable; and
   a retainer operatively connected to said optical coupler and removably connected to said optical connector for aligning said optical coupler and optical connector.

8. A package article for removably accepting a horizontally oriented fiber optic cable, and being adaptable to operatively connecting to a host card, comprising: a flexible circuit disposed between at least one translating die operatively connected to a laminate, and an optoelectronic die; means defining two heat sink carriers; said horizontally oriented fiber optic cable connected to said at least one translating die such that said fiber optic cable exits from said laminate in a direction substantially parallel to a horizontal plane defining an orientation of said laminate; an overmold frame that is supported by said laminate, said overmold frame having a cavity for receiving said flexible circuit, said optoelectronic die and said at least one heat sink carrier; at least one of said heat sink carriers being operatively connected to said optoelectronic die; said cavity of said overmold frame enclosing and securing at least one heat sink carrier, said optoelectronic die and said flexible circuit.

9. The package article in accordance with claim 8, further comprising an adhesive for attaching said flexible circuit to said at least one heat sink carrier and said laminate to said flexible circuit and said optoelectronic die to said at least one heat sink carrier.

10. The package article in accordance with claim 8, further comprising at least one faraday barrier shield supported by said overmold frame housing, said at least one faraday barrier shield providing RF isolation of said optoelectronic die.

11. The package article in accordance with claim 8, further comprising a fiber optic coupling disposed between said optoelectronic die and said fiber optic cable.

12. The package article in accordance with claim 11, further comprising a retainer, and wherein said fiber optic coupling disposed between said optoelectronic die and said fiber optic cable is snap connected to said retainer, said retainer being attached to said heat sink carrier.

13. The package article in accordance with claim 11, wherein said fiber optic coupling comprises an overmolding.

14. The package article in accordance with claim 11, wherein said fiber optic coupling comprises an optical coupler connected to said optoelectronic die at one end, said optical coupler being attached to an optical connector at an opposite end, said optical connector being connected to said fiber optic cable.

15. A package article for coupling a horizontally oriented set of fiber optic cables to vertically oriented translating dies, comprising: at least one fiber optic cable, said at least one fiber optic cable being oriented substantially parallel to a plane defining a substantially horizontally oriented laminate, a flexible circuit operatively disposed between said laminate and said at least one fiber optic cable, such that said at least one fiber optic cable exits from said laminate in a direction substantially parallel to a horizontal plane defining an orientation of said laminate, an overmold frame that is supported by said laminate, a heat sink carrier and at least one optoelectronic die supported by said overmold frame, said overmold frame having a cavity for receiving said flexible circuit, said at least one optoelectronic die and said heat sink carrier.

16. A package article for communicating with a host card, said package article having a structure in accordance with claim 15, and being disposed proximate said host card for transmitting electronic signals therebetween.

17. The package article in accordance with claim 15, further comprising at least one RF barrier shield, said overmold frame housing said at least one RF barrier shield for RF isolation of said at least one optoelectronic die.

18. The package article in accordance with claim 15, further comprising a fiber optic coupling disposed between said at least one optoelectronic die and said at least one fiber optic cable.

19. The package article in accordance with claim 18, further comprising a retainer, and wherein said fiber optic coupling disposed between said at least one optoelectronic die and said at least one fiber optic cable is removably secured to said retainer, said retainer being attached to said heatsink carrier.

20. The package article in accordance with claim 18, wherein said fiber optic coupling comprises an overmolding.

21. The package article in accordance with claim 18, wherein said fiber optic coupling comprises an optical coupler connected to said optoelectronic die at one end, said optical coupler being attached to an optical connector at an opposite end, said optical connector being connected to said at least one fiber optic cable.

22. A coupling device for coupling a multiple channel fiber optic cable to a multiple channel Vertical Cavity Surface Emitting Laser (VCSEL) transmitter and a multiple channel Perpendicularly Aligned Integrated Die (PAID) receiver, comprising: a flexible circuit disposed between at least one translating die operatively connected to a laminate, and an optoelectronic die; at least one heatsink carrier; a fiber optic cable connected to said at least one translating die such that said fiber optic cable exits from said laminate in a direction substantially parallel to a horizontal plane defining an orientation of said laminate; an overmold frame that is supported by said laminate, said overmold frame having a cavity for receiving said flexible circuit, said optoelectronic die and said at least one heatsink carrier; said at least one heatsink carrier being operatively connected to said optoelectronic die; said cavity of said overmold frame enclosing and securing said at least one heatsink carrier, said optoelectronic die and said flexible circuit.

23. The coupling device in accordance with claim 22, further comprising: at least one Faraday barrier shield, said over mold frame housing said at least one Faraday barrier shield providing RF isolation of said at least one optoelectronic die.

* * * * *

UNITED STATES PATENT AND TRADEMARK OFFICE
CERTIFICATE OF CORRECTION

PATENT NO. : 6,712,527 B1 Page 1 of 1
DATED : March 30, 2004
INVENTOR(S) : Benson Chan et al.

It is certified that error appears in the above-identified patent and that said Letters Patent is hereby corrected as shown below:

<u>Column 1,</u>
Line 5, insert -- This invention was made with Government support under Subcontract No. B338307 awarded by the Department of Energy. The government has certain rights to this invention. --.

Signed and Sealed this

Ninth Day of May, 2006

JON W. DUDAS
*Director of the United States Patent and Trademark Office*